(12) United States Patent
Ueda

(10) Patent No.: US 8,637,364 B2
(45) Date of Patent: Jan. 28, 2014

(54) SEMICONDUCTOR DEVICE AND METHOD OF MANUFACTURING THE SAME

(76) Inventor: Yasuhiko Ueda, Tokyo (JP)

( * ) Notice: Subject to any disclaimer, the term of this patent is extended or adjusted under 35 U.S.C. 154(b) by 8 days.

(21) Appl. No.: 13/455,166

(22) Filed: Apr. 25, 2012

(65) Prior Publication Data

US 2012/0273922 A1 Nov. 1, 2012

(30) Foreign Application Priority Data

Apr. 27, 2011 (JP) ................................. 2011-099587

(51) Int. Cl.
*H01L 21/8242* (2006.01)

(52) U.S. Cl.
USPC .................. 438/241; 438/397; 257/E21.648; 257/E21.65

(58) Field of Classification Search
USPC .......................... 438/239, 241, 396, 397, 398; 257/E21.648, E21.65
See application file for complete search history.

(56) References Cited

U.S. PATENT DOCUMENTS

| 7,026,208 | B2 | 4/2006 | Park et al. |
|---|---|---|---|
| 7,332,395 | B2 | 2/2008 | Yokoi |
| 2003/0178728 | A1 | 9/2003 | Park et al. |
| 2006/0099768 | A1 | 5/2006 | Yokoi |
| 2011/0183488 | A1* | 7/2011 | Takaishi ........................ 438/381 |

FOREIGN PATENT DOCUMENTS

| JP | 2003-297952 | 10/2003 |
|---|---|---|
| JP | 2006-135261 | 5/2006 |

* cited by examiner

*Primary Examiner* — Hoai V Pham
(74) *Attorney, Agent, or Firm* — Young & Thompson

(57) ABSTRACT

An amorphous carbon film and an interlayer insulation film are formed in a memory cell region and a peripheral circuit region, respectively. An insulating film is formed on the amorphous carbon film and the interlayer insulation film. A portion of the insulating film that corresponds to capacitors on the amorphous carbon film is removed so that lower electrodes of the capacitors are supported from opposite sides of the lower electrodes. An insulating film pattern continuously extends from the memory cell region to the peripheral circuit region wholly covered with the insulating film pattern. Subsequently, the amorphous carbon film is removed to leave the capacitors supported by the insulating film pattern on both sides of the lower electrodes.

12 Claims, 12 Drawing Sheets

(a) PERIPHERAL CIRCUIT REGION | PERIPHERAL AREA OF MEMORY CELL REGION (b) CENTRAL AREA OF MEMORY CELL REGION

SEMICONDUCTOR DEVICE AND METHOD OF MANUFACTURING THE SAME

This application is based upon and claims the benefit of priority from Japanese patent application No. 2011-099587, filed on Apr. 27, 2011, the disclosure of which is incorporated herein in its entirety by reference.

BACKGROUND

1. Field of the Invention

The present invention relates to a semiconductor device and a method of manufacturing the same.

2. Description of the Related Art

In a manufacturing process of a semiconductor device, a dry etching method is preformed by the use of a resist mask to form a pattern on a film to be processed, such as an interlayer insulation film film, deposited on a semiconductor substrate. As a degree of integration of semiconductor devices becomes high, patterns become finer and finer. Therefore, a dry etching method should be performed with a high precision in order to delineate finer patterns.

Although a higher degree of integration can reduce a processing area that is processed by a dry etching, a processing depth in the processing area is apt to become deep. In this connection, a ratio of a processing depth to a processing area which is called an aspect ratio tends to become high. Especially, forming a "high-aspect-ratio" pattern is required to obtain a hole pattern which forms lower electrodes of capacitors. However, as an aspect ratio becomes higher, a dry etching method encounters a difficulty in processing.

As a semiconductor device required to have such a high aspect ratio, there is exemplified a DRAM which includes cylindrical capacitors each having a lower electrode, a capacitance insulating film, and an upper electrode. Patent Literature 1 (JP-A 2003-297952) states that a lower electrode of a cylindrical capacitor is more likely to fall down or collapse if the lower electrode becomes thicker or higher. Under the circumstances, Patent Literature 1 has proposed a structure of supporting a lower electrode of each of cylindrical capacitors by a supporter film which is provided on a mold oxide film formed of a BPSG or a silicon nitride film. Specifically, the supporter layer is structured by a line pattern and a frame connected to the line pattern and may be formed by a silicon nitride film. The frame covers a peripheral circuit region formed on a semiconductor substrate (see Claim 1).

Furthermore, according to Patent Literature 1, the line pattern and the mold oxide film are dry-etched so that a conductive region is exposed. A large number of storage node holes are formed in rows and columns. A cylindrical capacitor is formed within each of the storage node holes. Thus, Patent Literature 1 discloses that the supporter film for supporting a lower electrode is formed within each of the storage node holes opened across the line pattern (see Claim 19).

When the cylindrical capacitors are formed by dry-etching a BPSG or a silicon nitride film, as mentioned in Patent Literature 1, deep storage node holes cannot be etched because the silicon nitride film or the like has a low selectivity to dry etching. Therefore, if deep holes for cylindrical capacitors are formed as the storage node holes, problems, such as bowing, may often take place.

Meanwhile, one of reasons why processing becomes difficult about attaining a higher aspect is that a sputtering effect of an ionized etching gas is used to dry-etch a silicon oxide film ($SiO_2$), which has widely been used as a material for an interlayer insulating film. Specifically, when a pattern has deep holes of a higher aspect ratio, ions collide with sidewalls adjacent to each bottom of the pattern. Therefore, the kinetic energy of the ions is attenuated. Thus, the sputtering effect is also lessened. Furthermore, when a silicon oxide film is dry-etched, fluorine radicals are generated from an etching gas including fluorine (F) and bring about isotropic etching. Accordingly, side-etching occurs locally so as to produce a bowing shape. Thus, such side-etching often results in undesired contacts between adjacent pattern portions. It is difficult to avoid those phenomena as long as a silicon oxide film is used in a dry etching process.

Using an amorphous carbon film, which would be hereinafter abbreviated to an AC film, has been proposed instead of a silicon oxide film in order to avoid the above phenomena. A hole having a high aspect ratio can readily be formed by using an AC film because an AC film has a very high selectivity to oxygen-based plasma etching as compared to other films. However, the problem of the AC film is that the AC film cannot be left on a semiconductor substrate. Therefore, the AC film must be removed finally.

Patent Literature 2 (JP-A 2006-135261) has proposed a method of manufacturing cylindrical capacitors using an AC film as an insulating film between sacrifice layers. According to Patent Literature 2, an AC film is dry-etched by using an etching gas primarily containing oxygen ($O_2$). In this method, dry-etching is conducted mainly by radical reactions. Therefore, dry-etching can be advanced irrespective of attenuation of the kinetic energy of ions. Furthermore, since occurrence of bowing due to radical reactions can be suppressed by using an additive gas, a pattern having a high aspect ratio can be formed with high accuracy.

Herein, it is assumed that a supporter layer having a line pattern and a frame connected to the line pattern is used as in Patent Literature 1. In this event, the line pattern of a line shape is connected to the frame and is partially separated and becomes discontinuous due to the formation of storage node holes. Thus, the supporter layer of the line shape has a weak mechanical strength and is insufficient to support the lower layers of a high aspect ratio.

In a case where an AC film is used as a sacrifice layer to support the lower electrodes and is dry-etched as in Patent Literature 2, it has been found out that a further improvement should be required.

SUMMARY

The present invention seeks to provide a method of manufacturing a semiconductor device that can improve at least one of problems caused if an AC film (i.e., an amorphous carbon film) is used.

The present invention further seeks to provide a method of manufacturing a semiconductor device that can prevent deformation of an intermediate portion of a lower electrode that would be caused at the time of removal of an AC film and can prevent a short circuit of the intermediate portion or the like by connecting an insulating film to opposite sides of the intermediate portion.

The present invention seeks to provide a semiconductor device that is obtainable by the above methods and can firmly support a lower electrode.

According to a first aspect of the present invention, there is provided a method of manufacturing a semiconductor device formed on a semiconductor substrate which has a memory cell region and a peripheral circuit region. In this method, a first amorphous carbon is formed in the memory cell region and a first interlayer insulation film is formed in the peripheral circuit region. A first insulating film is formed so that the first amorphous carbon film and the first interlayer insulation film are covered with the first insulating film. A portion of the first insulating film that corresponds to a capacitor portion to be formed in the memory cell region is removed so as to leave the remaining portion of the first insulating film which sandwiches the capacitor portion from at least opposite sides of the capacitor portion and which forms a first insulating film pattern. The first insulating film pattern continuously extends from the memory cell region to the peripheral circuit region and wholly covers the peripheral circuit region. A capacitor is formed in the capacitor portion from which the first insulating film has been removed. Then, the first amorphous carbon film is removed.

According to a second aspect of the present invention, there is provided a method of manufacturing a semiconductor device. In this method, a first amorphous carbon film is formed on a semiconductor substrate. A first insulating film is formed so that the first amorphous carbon film is covered with the first insulating film. A first pattern is formed in the first insulating film. A second amorphous carbon film is formed so that the first pattern is filled with the second amorphous carbon film. A second insulating film is formed so that the second amorphous carbon film is covered with the second insulating film. A second pattern is formed in the second insulating film. A hole is formed so as to extend from the second insulating film to the first amorphous carbon film while the second pattern is used as a mask. A conductive film is formed so that an inner wall of the hole is covered with the conductive film. The first amorphous carbon film and the second amorphous carbon film are removed after the forming of the conductive film.

According to a third aspect of the present invention, there is provided semiconductor device having a semiconductor substrate, a memory cell region on the semiconductor substrate, and a peripheral circuit region located around the memory cell region on the semiconductor substrate. The semiconductor device has a boundary area between the peripheral circuit region and the memory cell region and a plurality of cylindrical capacitors provided in the memory cell region. Each of the cylindrical capacitors includes a lower electrode extending in a depth direction, a capacitance insulating film provided on the lower electrode, and an upper electrode provided so that the capacitance insulating film is covered with the upper electrode. The semiconductor device includes a support surface contacted with at least opposite sides of the lower electrode of each of the cylindrical capacitors. The support surface continuously extends from the memory cell region to the peripheral circuit region and wholly covers the peripheral circuit region.

According to the present invention, it is possible to obtain a capacitor having a structure for supporting an upper portion and/or a lower portion of a lower electrode by a support film that not only contacts the lower electrode but also extends continuously to a peripheral circuit portion. Therefore, it is possible to obtain a semiconductor device in which no short circuit occurs due to collapse of an intermediate portion of the lower electrode. Furthermore, with formation of three or more stacked films of an amorphous carbon film and a support film formed on the amorphous carbon film, it is possible to obtain a capacitor that causes no collapse or the like even if a cylindrical hole having a higher aspect ratio is formed. It is also possible to obtain a semiconductor device including such a capacitor.

BRIEF DESCRIPTION OF THE DRAWINGS

The above features and advantages of the present invention will be more apparent from the following description of certain embodiments taken in conjunction with accompanying drawings, in which:

FIG. 2(a) is a cross-sectional view showing a boundary area between a peripheral circuit region and a memory cell region shown in FIG. 1. FIG. 2(b) is a cross-sectional view showing a central area of the memory cell region.

FIGS. 3(a) and 3(b) show the boundary area and the central area of the memory cell region, respectively. Upper figures and lower figures of FIGS. 3(a) and 3(b) are plan views and cross-sectional views, respectively.

FIGS. 4(a) and 4(b) show the boundary area and the central area of the memory cell region, respectively.

FIGS. 5(a) and 5(b) show the boundary area and the central area of the memory cell region, respectively.

FIGS. 6(a) and 6(b) show the boundary area and the central area of the memory cell region, respectively.

FIGS. 7(a) and 7(b) show the boundary area and the central area of the memory cell region, respectively.

FIGS. 8(a) and 8(b) show the boundary area and the central area of the memory cell region, respectively.

FIGS. 9(a) and 9(b) show the boundary area and the central area of the memory cell region, respectively.

FIGS. 10(a) and 10(b) show the boundary area and the central area of the memory cell region, respectively, and illustrate a process of forming lower electrodes of capacitors.

FIGS. 11(a) and 11(b) show the boundary area and the central area of the memory cell region, respectively.

FIGS. 12(a) and 12(b) show a configuration for forming a dielectric film and upper electrodes in the boundary area and the central area of the memory cell region, respectively.

DETAILED DESCRIPTION OF THE PREFERRED EMBODIMENTS

A semiconductor device according to preferred embodiments of the present invention will be described below with reference to the accompanying drawings. In the following embodiments, a dynamic random access memory (DRAM) is described as an example of a semiconductor device. Nevertheless, the present invention is not limited to a DRAM.

Figure 1:
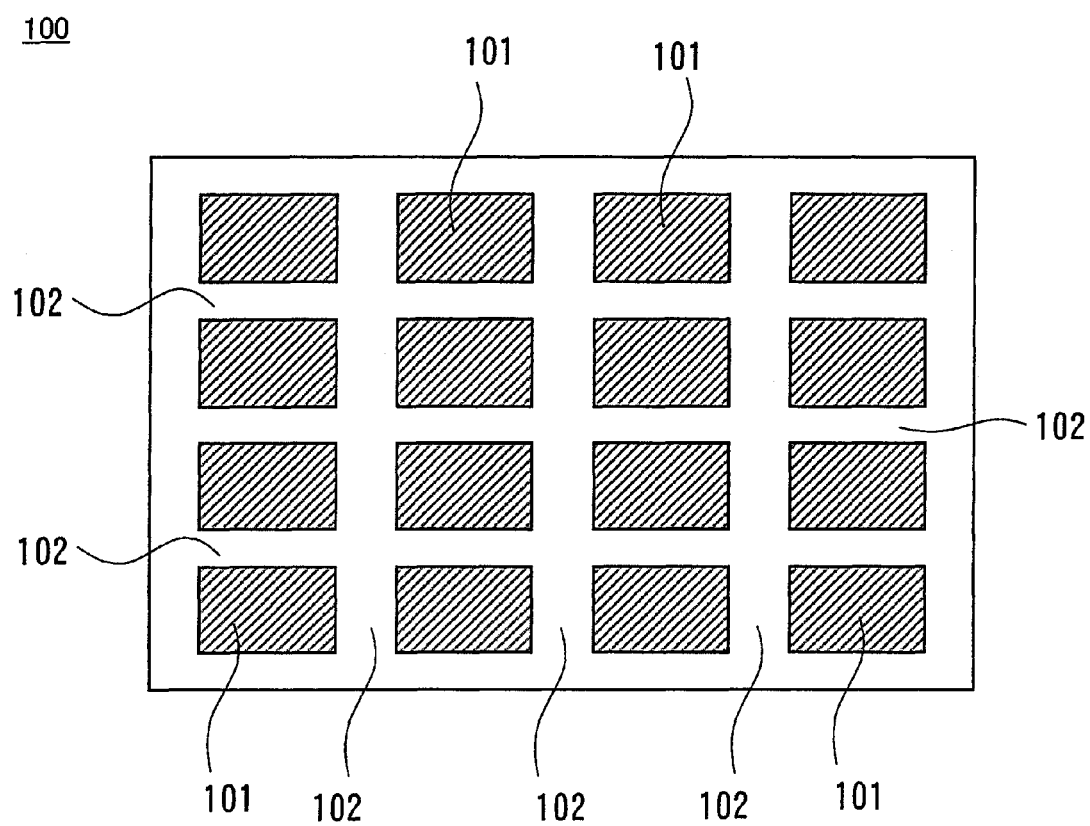
FIG. 1 is a plan view of a semiconductor device according to an embodiment of the present invention, which shows an outlined arrangement of a dynamic random access memory (DRAM) as an example of the semiconductor device.

FIG. 1 shows a two-dimensional structure of a semiconductor device 100 according to an exemplary embodiment of the present invention. In FIG. 1, a DRAM is illustrated as an example of the semiconductor device 100. In the two-dimensional view of FIG. 1, the DRAM can be roughly divided into memory cell regions, a peripheral circuit region formed on a semiconductor substrate, and a boundary area between the memory cell regions and the peripheral circuit region. It should be understood that the expression "formed on a semiconductor substrate" or similar expressions include not only being formed in direct contact with a semiconductor substrate, but also being arranged above a semiconductor substrate out of direct contact with the semiconductor substrate.

Specifically, as shown in FIG. 1, a plurality of memory cell regions 101 are arranged on the DRAM. A peripheral circuit region 102 is arranged so that the memory cell regions 101 are surrounded by the peripheral circuit region 102.

The peripheral circuit region 102 includes sense amplifier circuits, driver circuits for word lines, input/output circuits for external devices, and the like. FIG. 1 only shows a mere layout example of the DRAM. Therefore, the number and position of the memory cell regions are not limited to those illustrated in FIG. 1.

Figure 2:
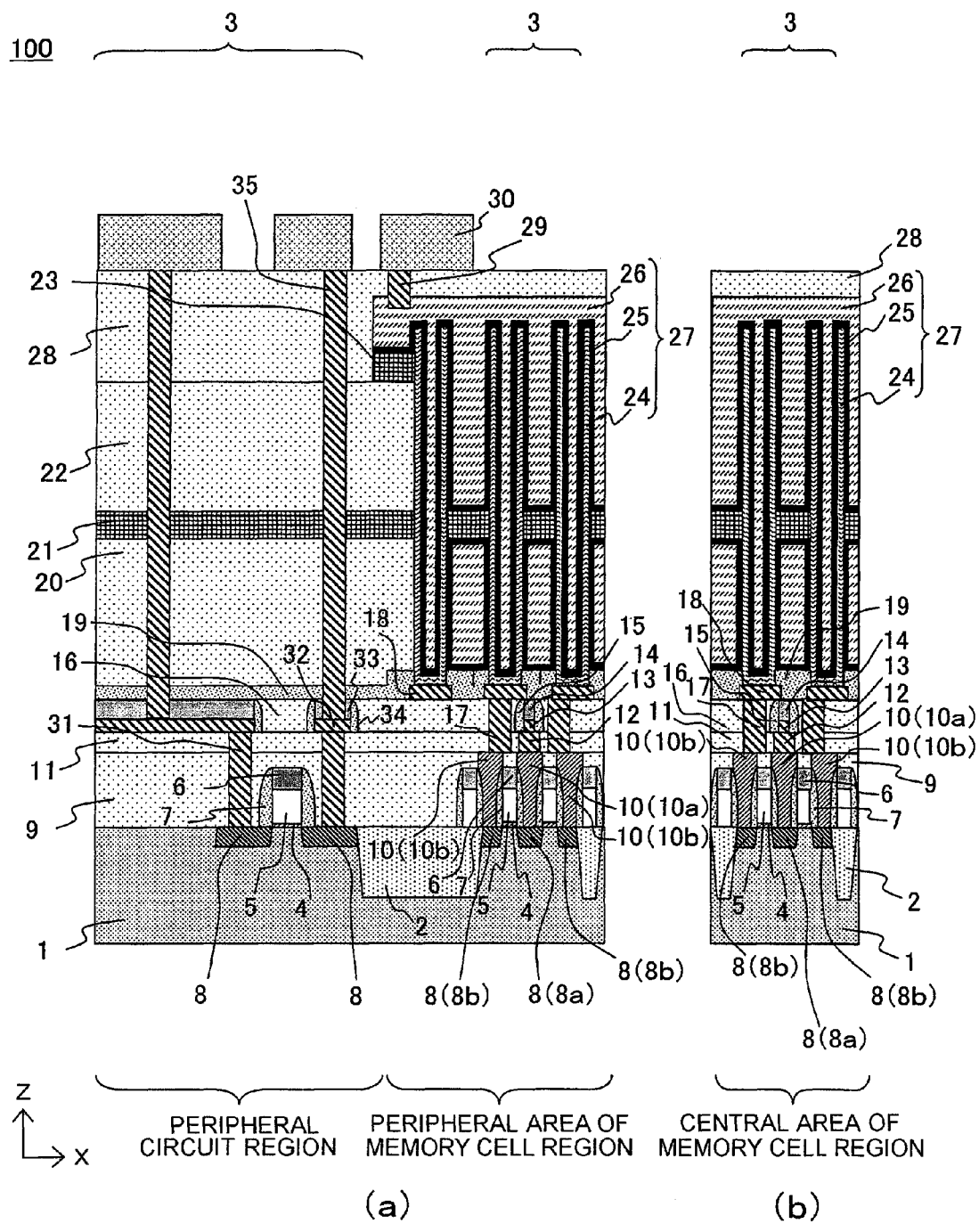
FIG. 2 is comprised of (a) and (b) showing schematic cross-sectional views of a structure of a DRAM as an example of the semiconductor device according to the exemplary embodiment of the present invention.
Figure 3:
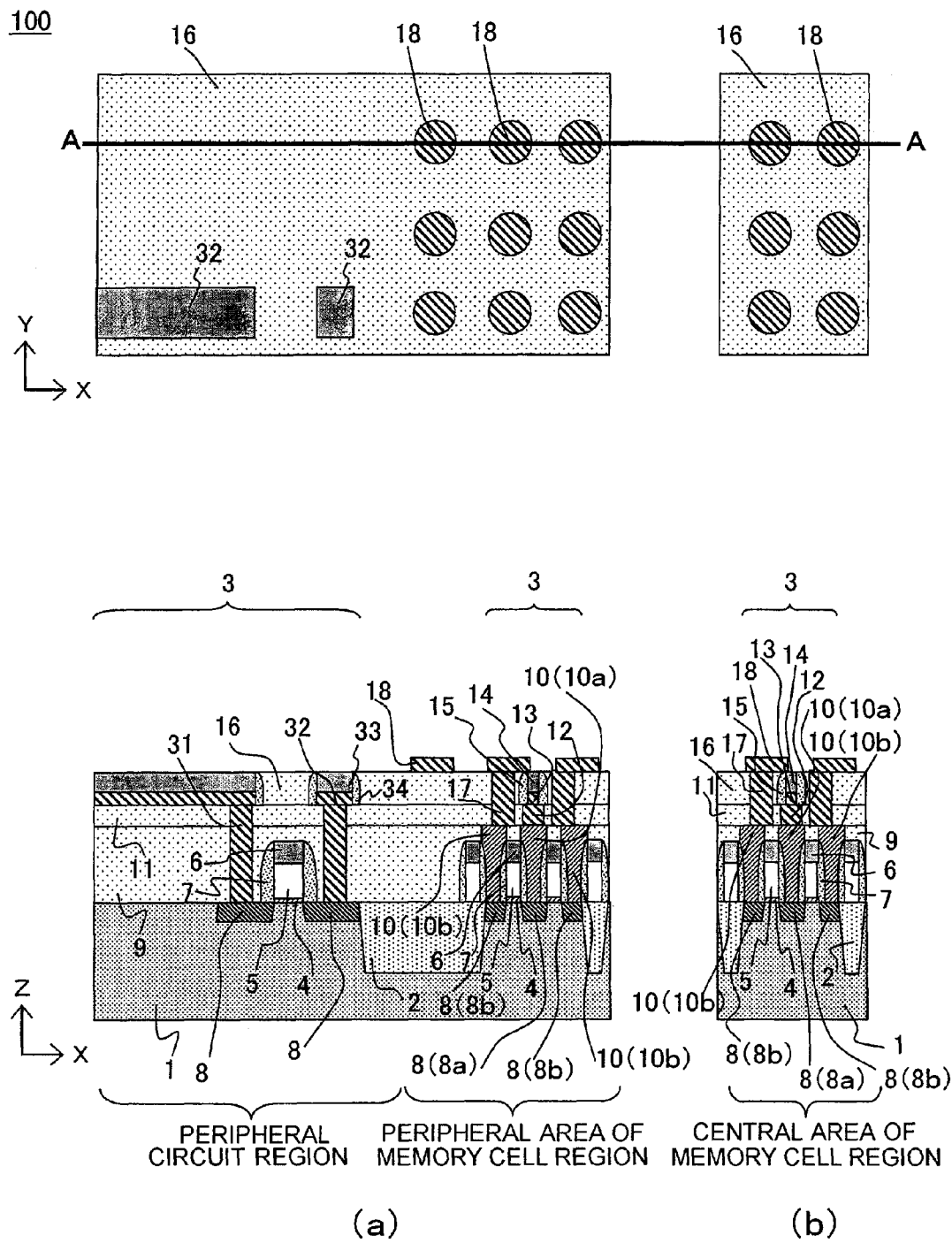
FIG. 3 is comprised of (a) and (b) showing diagrams explanatory of a process according to the present invention.
Figure 4:
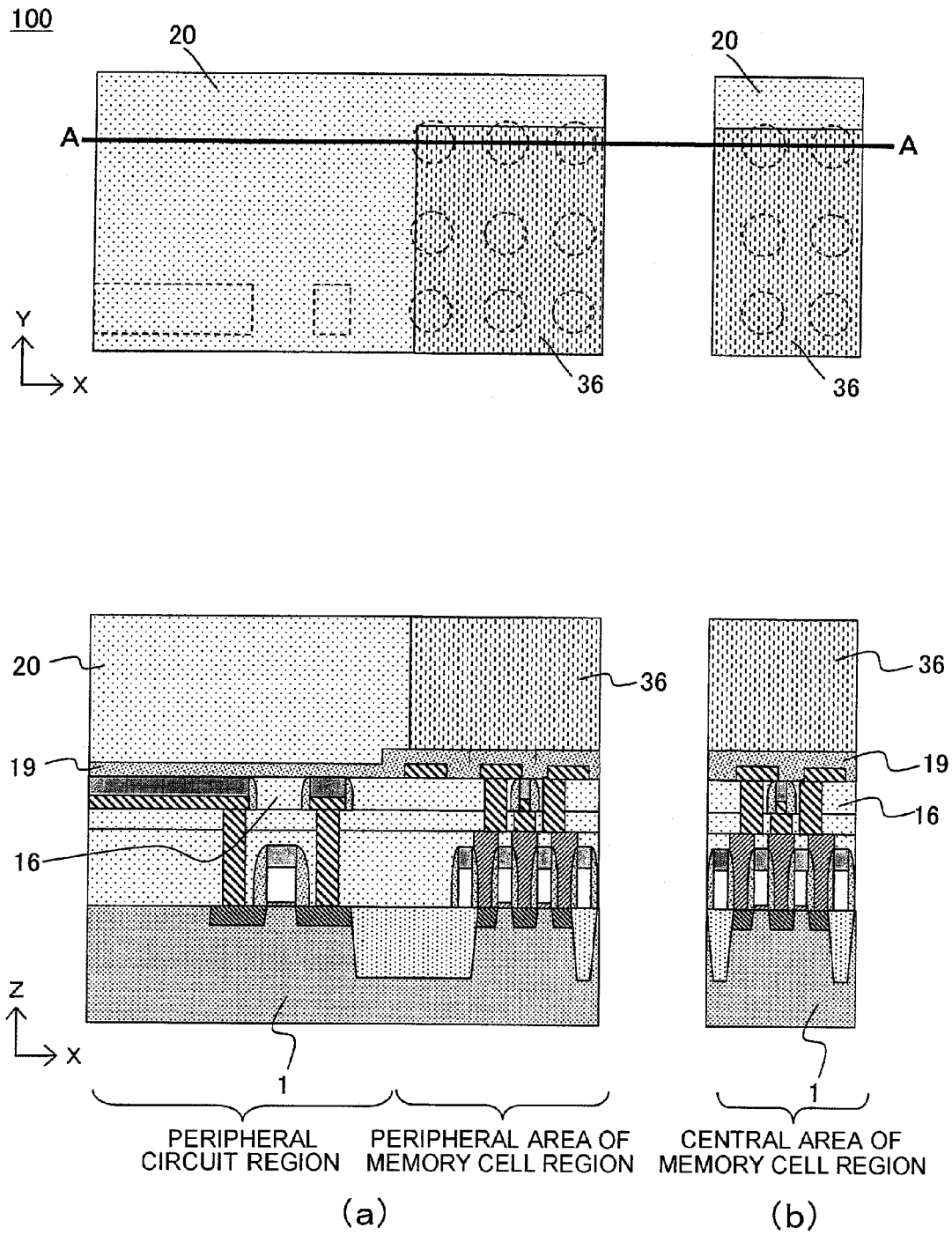
FIG. 4 is comprised of (a) and (b) showing diagrams explanatory of a process performed after the process shown in FIGS. 3(a) and 3(b).
Figure 5:
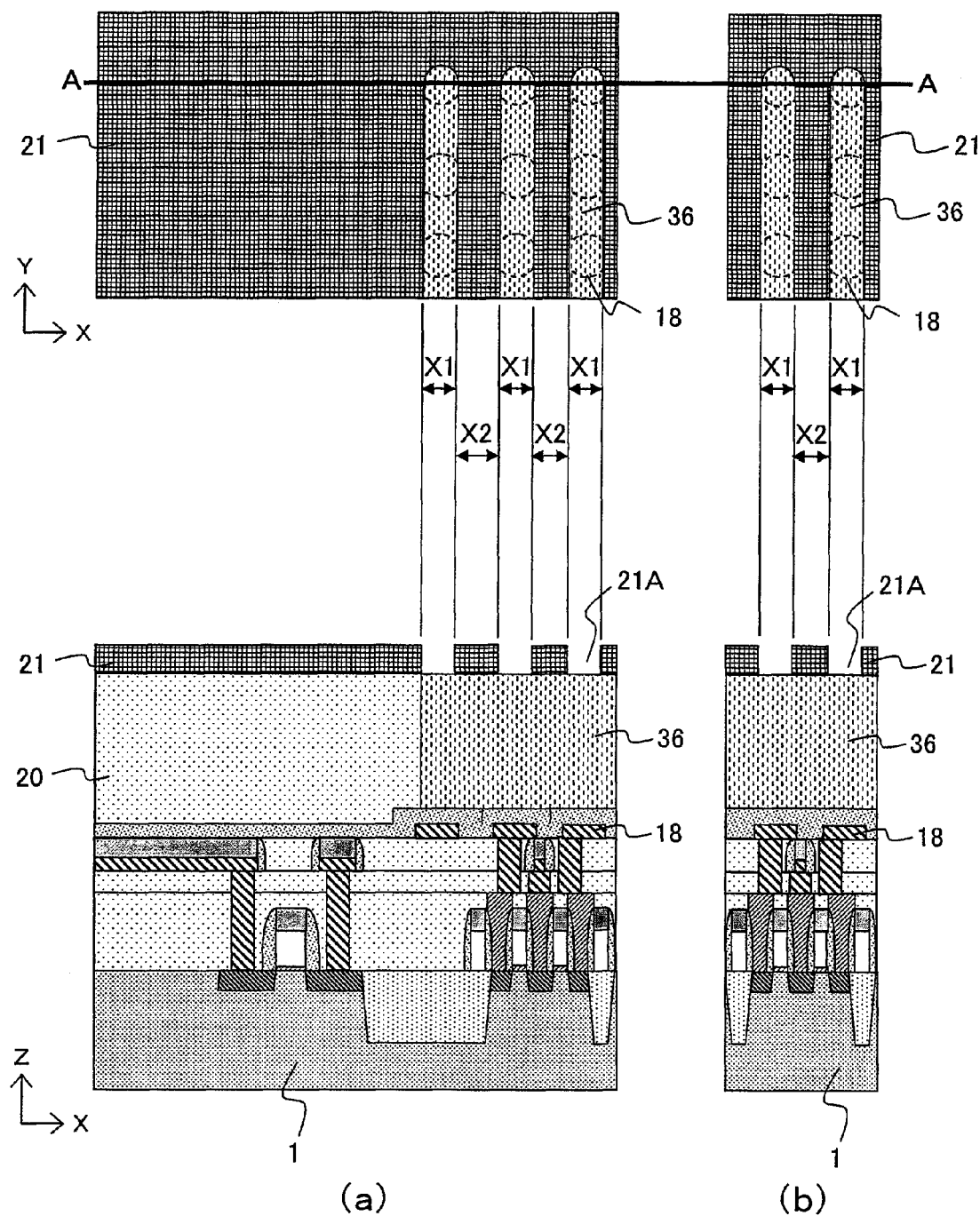
FIG. 5 is comprised of (a) and (b) showing diagrams explanatory of a process performed after the process shown in FIGS. 4(a) and 4(b).
Figure 6:
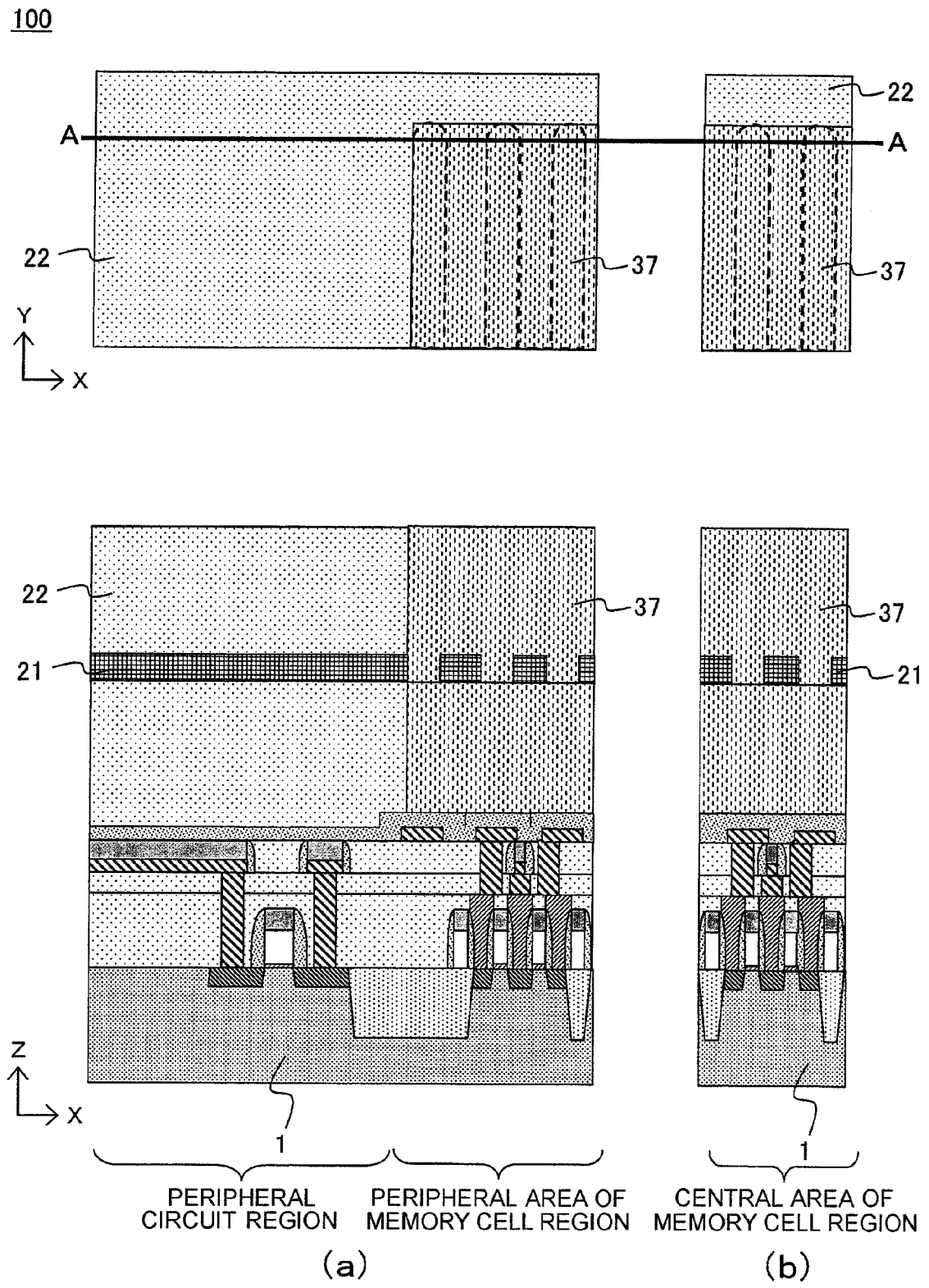
FIG. 6 is comprised of (a) and (b) showing diagram explanatory of a process performed after the process shown in FIGS. 5(a) and 5(b).
Figure 7:
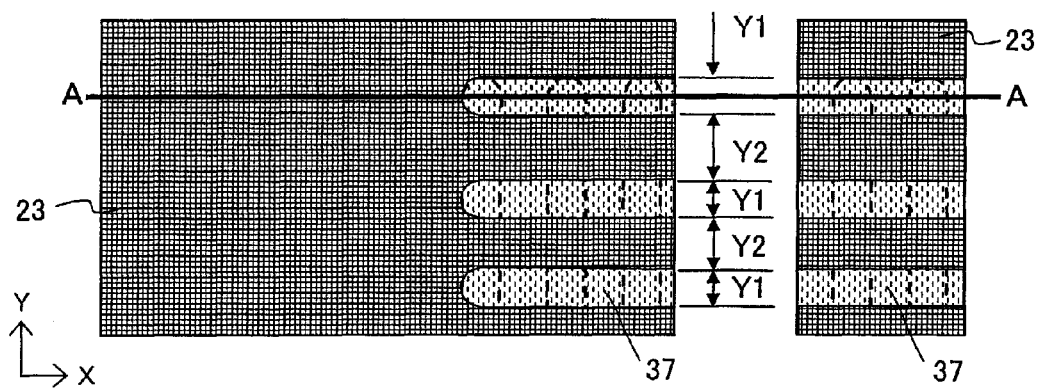
FIG. 7 is comprised of (a) and (b) showing diagrams explanatory of a process performed after the process shown in FIGS. 6(a) and 6(b).
Figure 7:
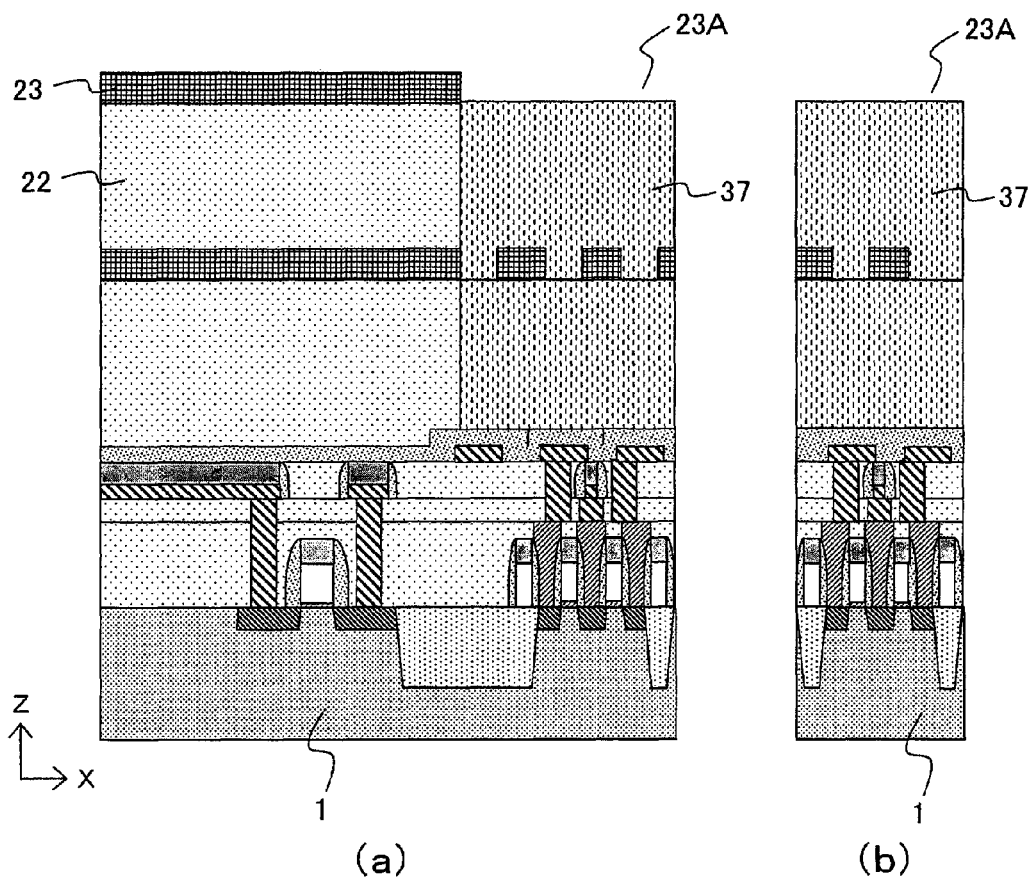
Figure 8:
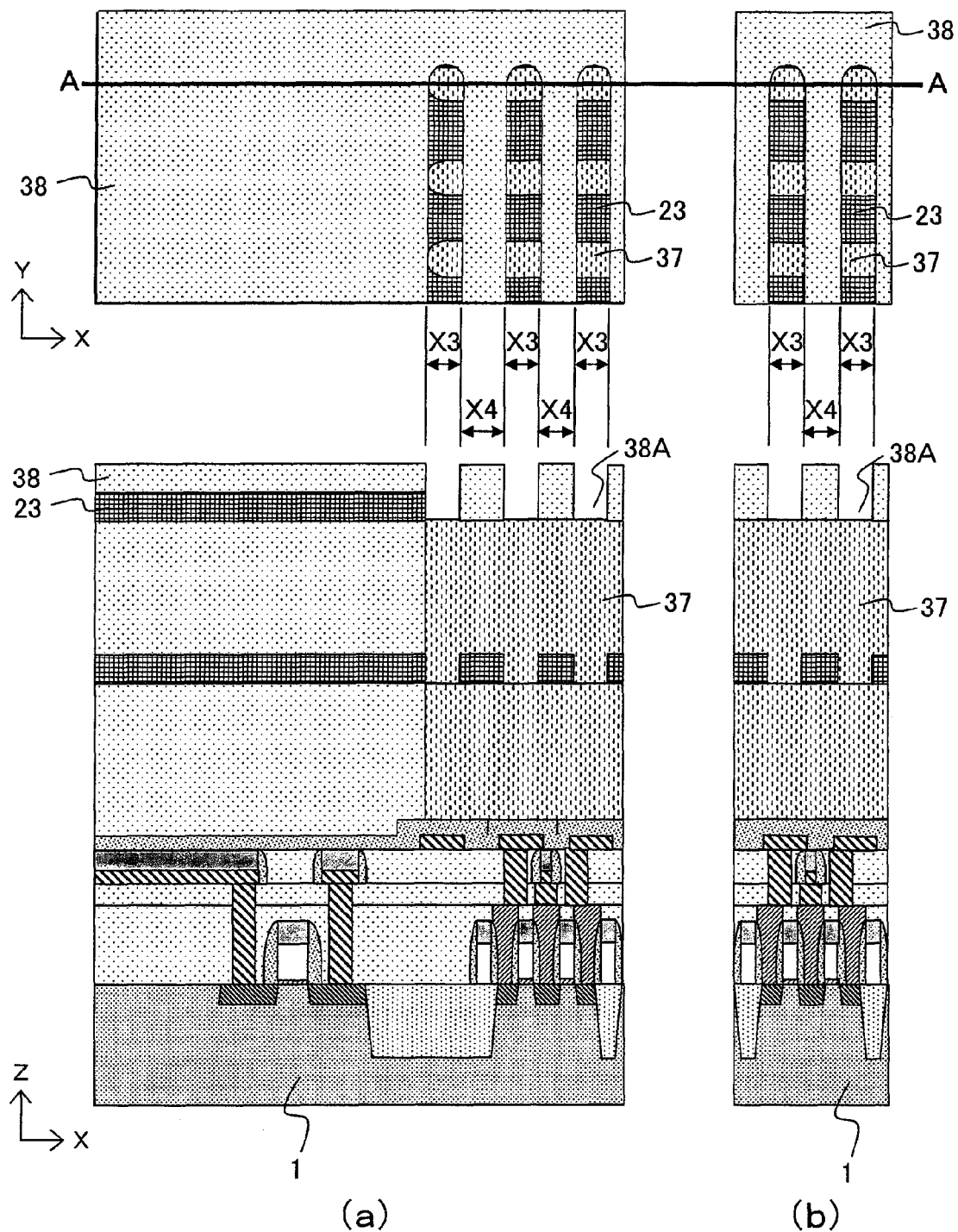
FIG. 8 is comprised of (a) and (b) showing diagrams explanatory of a process performed after the process shown in FIGS. 7(a) and 7(b).
Figure 9:
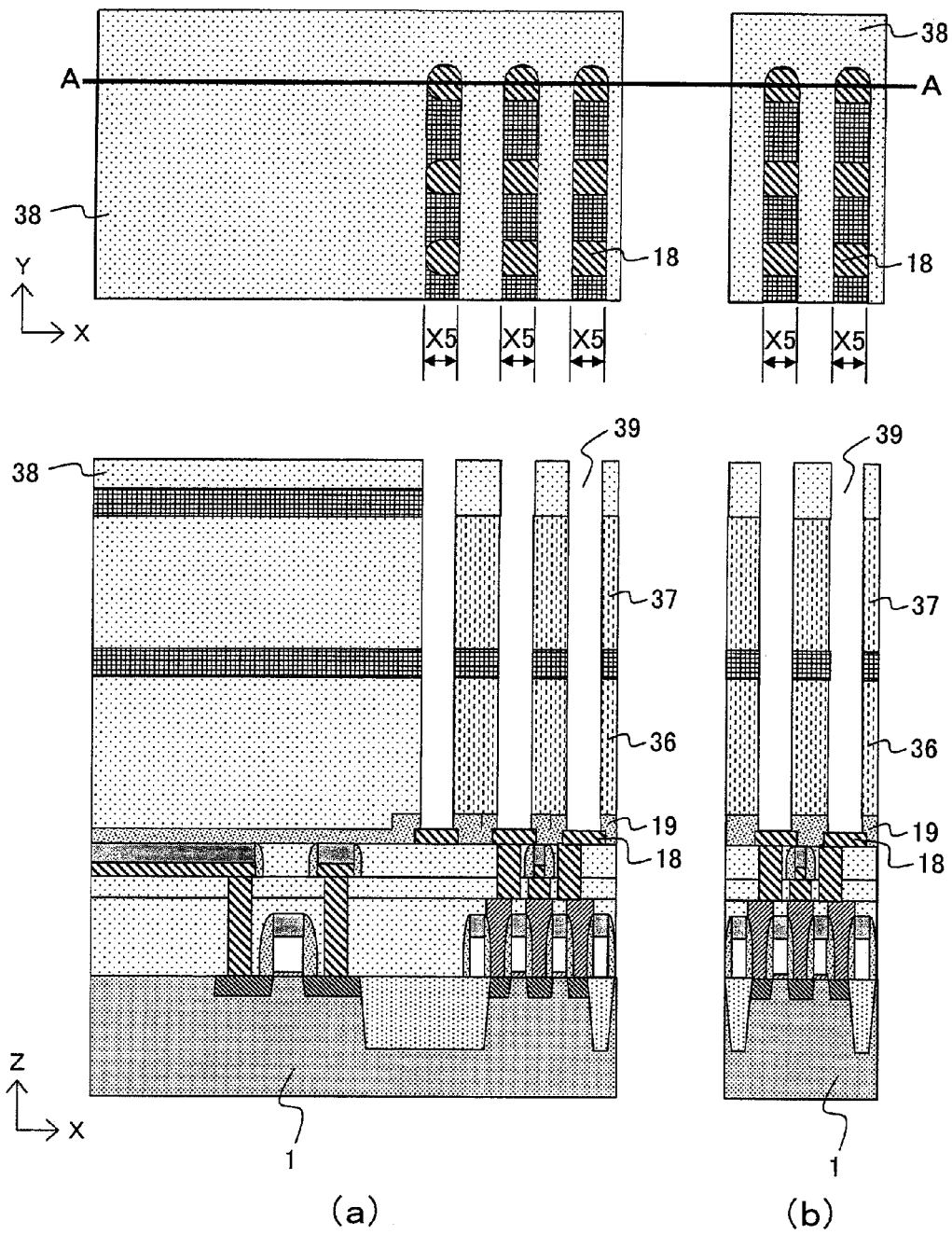
FIG. 9 is comprised of (a) and (b) showing diagrams explanatory of a process performed after the process shown in FIGS. 8(a) and 8(b).

FIGS. 2(a) and 2(b) are schematic cross-sectional views showing a structure of a DRAM as an example of the semiconductor device 100 according to an exemplary embodiment of the present invention. FIG. 2(a) shows a boundary area between the peripheral circuit region 102 and the memory cell region 101 shown in FIG. 1. FIG. 2(b) shows a central area of the memory cell region 101. The boundary area illustrated in FIG. 2(a) is divided into the peripheral circuit region and a peripheral area of the memory cell region. In the following description, the peripheral area and the central area of the memory cell regions may collectively be referred to as a memory cell region.

The memory cell regions and the peripheral circuit region of the DRAM, which is an example of the semiconductor device according to the exemplary embodiment shown in FIGS. 2(a) and 2(b), are provided on a semiconductor substrate 1. In the following description, the semiconductor substrate 1 will be described as being a silicon substrate 1. Planer MOS transistors, which are hereinafter referred to as MOS transistors, are provided in each of the memory cell regions and the peripheral circuit region.

The illustrated planer MOS transistors are located in active regions 3 surrounded by shallow trench isolation (STI) 2, which serves as a device isolation region provided in the silicon substrate 1.

As shown in FIGS. 2(a) and 2(b), each of the planer MOS transistors provided in the memory cell region (peripheral area and central area) and the peripheral circuit region includes a gate insulating film 4 provided on a surface of the silicon substrate 1, a gate electrode 5 provided so that the gate insulating film 4 is covered with the gate electrode 5, and diffusion layers 8 provided around a portion located below the gate insulating film 4. The diffusion layers 8 serve as a source and a drain.

Furthermore, each of the gate electrodes 5 has an upper surface covered with an insulating film 6 and a sidewall covered with a sidewall insulating film 7. Each diffusion layer 8 is not located right below the gate insulating film 4 and is located within a portion of the silicon substrate 1 on which no gate insulating film 4 is formed.

For the sake of convenience, only two MOS transistors are illustrated in the active region 3 of FIG. 2(b). In practice, several thousands to several hundreds of thousands of MOS transistors are arranged in the active region 3. The diffusion layers 8 of each of the MOS transistors are located at an upper portion of the silicon substrate 1, which is covered with a first interlayer insulation film 9. The diffusion layers 8 have a conductive type inverse to an impurity of the silicon substrate 1.

First contact plugs 10 are connected to the diffusion layers 8 of the MOS transistors located in the peripheral area and the central area of the memory cell region. Those first contact plugs 10 are positioned between the sidewall insulating films 7 of adjacent MOS transistors. The first contact plugs 10 extend through the first interlayer insulation film 9. A second interlayer insulation film 11 is formed on the first interlayer insulation film 9.

In FIGS. 2(a) and 2(b), the MOS transistors in the memory cell region have diffusion layers 8a and diffusion layers 8b located on opposite sides of each of the diffusion layers 8a. First contact plugs 10a are connected to the diffusion layers 8a. Each of the first contact plugs 10a is connected to a second contact plug 12, which extends through the second interlayer insulation film 11. Furthermore, a third interlayer insulation film 16 is formed on the second interlayer insulation film 11.

First contact plugs 10b are connected to the diffusion layers 8b in the memory cell region. Each of the first contact plugs 10b is connected to a third contact plug 17, which extends through the second interlayer insulation film 11 and the third interlayer insulation film 16.

In the illustrated memory cell region, first wires 13, which serve as bit lines, are located on the second interlayer insulation film 11. Each of those first wires 13 is covered with an insulating film 14 and a sidewall insulating film 15. The first wires 13 are connected to the second contact plugs 12.

Contact pads 18 are formed on the third interlayer insulation film 16 in the memory cell region. Those contact pads 18 are provided for maintaining an alignment margin between cylindrical capacitors 27, which will be described later, and the third contact plugs 17. Each of the contact pads 18 is connected to the third contact plug 17 located below the contact pad 18.

The cylindrical capacitors 27 are provided above the contact pads 18. In the illustrated example, each of the cylindrical capacitors 27 includes a lower electrode 24, a capacitance insulating film 25, and an upper electrode 26.

The illustrated cylindrical capacitors 27 are provided so as to extend through a fourth interlayer insulation film 20, a fifth interlayer insulation film 22, and a cover film 19 for protecting the third interlayer insulation film 16.

Specifically, the lower electrode 24 of each of the cylindrical capacitors 27 is connected to the contact pad 18. Side surfaces of the capacitors 27 are connected to a first support film 21 and a second support film 23. The first support film 21 and the second support film 23 are provided for preventing collapse of the capacitors 27 and spaced from each other in the depth direction. As described later, the first support film 21 and the second support film 23 are arranged two-dimensionally so as to form a first insulating film pattern and a second insulating film pattern, respectively. In addition, each of the first and the second support films 21 and 23 wholly cover the peripheral circuit region, as will become clear.

Figure 10:
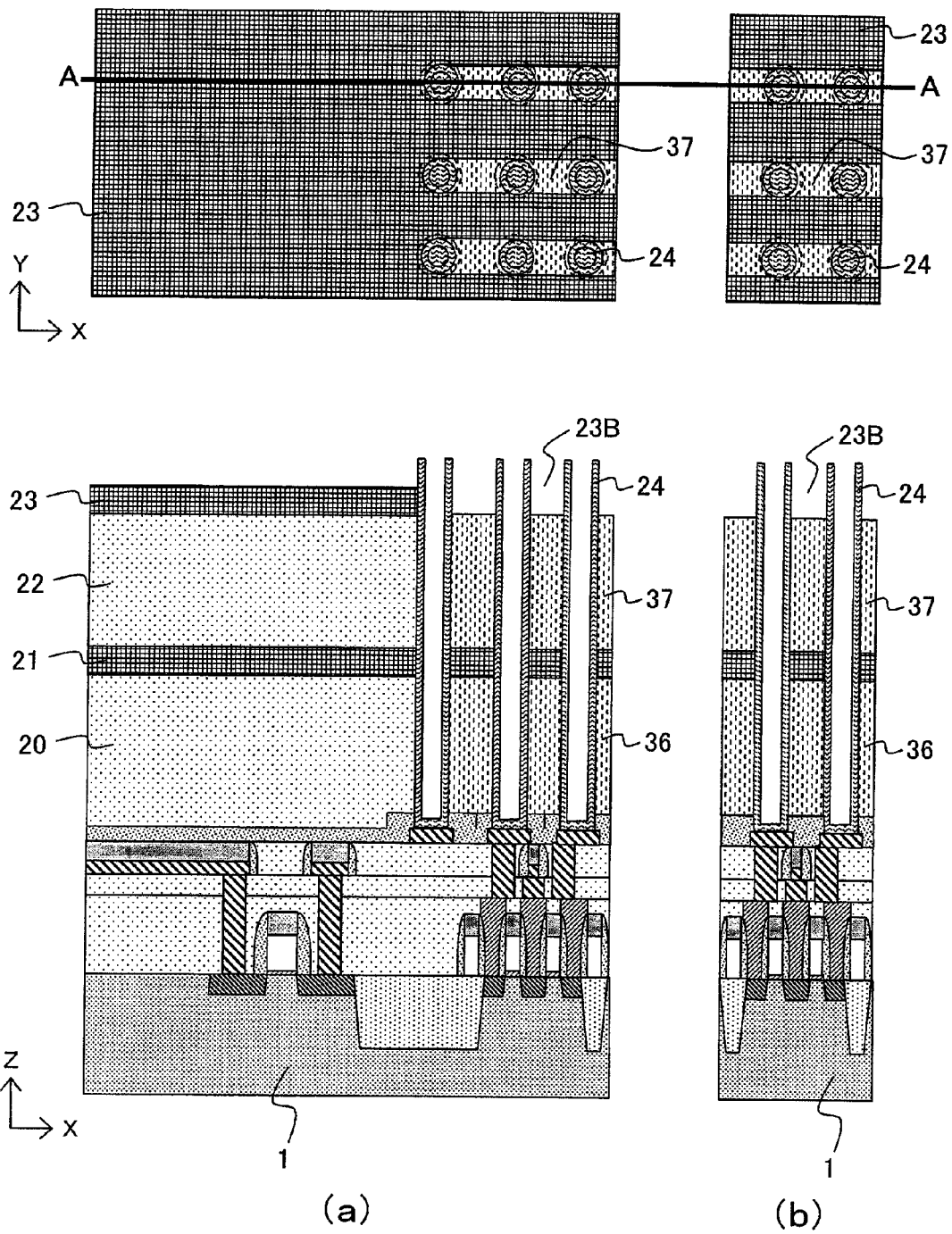
FIG. 10 is comprised of (a) and (b) showing diagrams explanatory of a process performed after the process shown in FIGS. 9(a) and 9(b).
Figure 11:
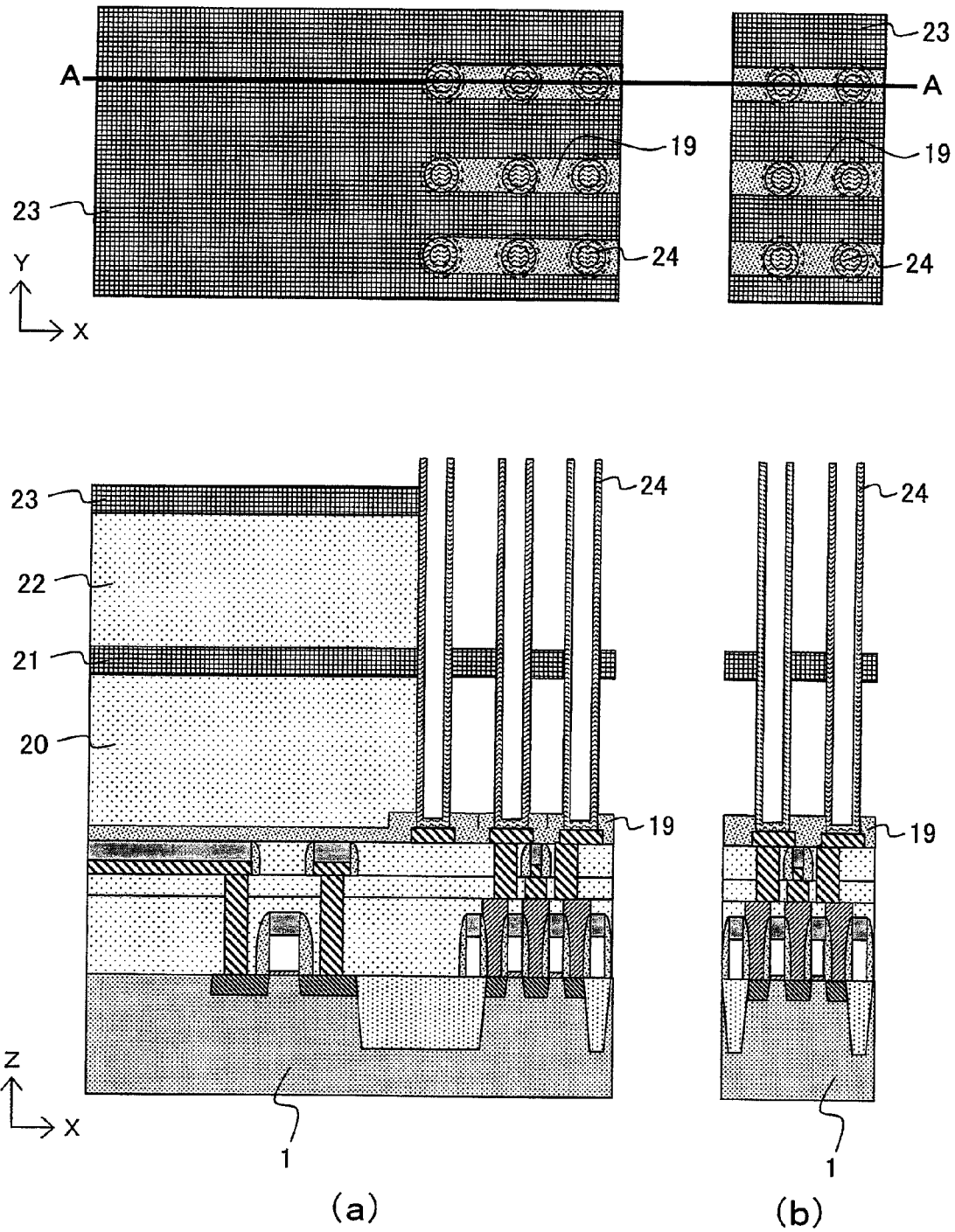
FIG. 11 is comprised of (a) and (b) showing diagrams explanatory of a process performed after the process shown in FIGS. 10(a) and 10(b).
Figure 12:
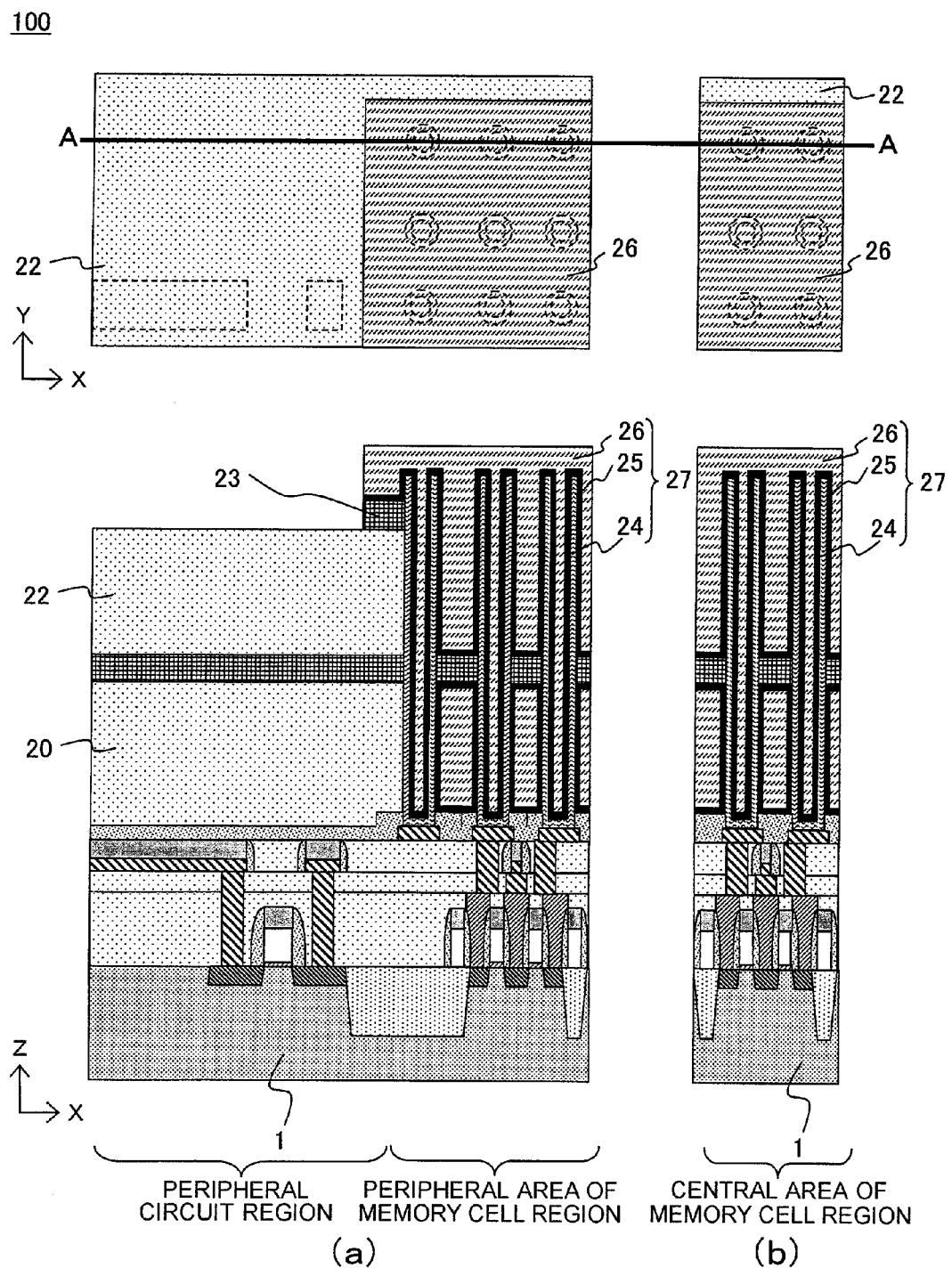
FIG. 12 is comprised of (a) and (b) showing diagrams explanatory of a process performed after the process shown in FIGS. 10(a) and 10(b).

Thus, since the lower electrodes 24 are connected to the first support film 21 and the second support film 23, adjacent capacitors 27 are supported by each other. In the cross-sectional views shown in FIGS. 2(a) and 2(b), the second support film 23 does not support adjacent capacitors 27. However, the second support film 23 supports adjacent capacitors 27 in a two-dimensional view as shown in a plan view of FIGS. 10(a) and 10(b), which will be described later.

Fourth contact plugs 29 are arranged on the capacitors 27 in the peripheral area of the memory cell region. The fourth contact plugs 29 are connected to the upper electrodes 26. The fourth contact plugs 29 are provided in a sixth interlayer insulation film 28 which covers the upper electrodes 26 and the fourth contact plugs 29 are connected to second wires 30 formed on the sixth interlayer insulation film 28.

Fifth contact plugs 31 are connected to the diffusion layer 8 formed in the peripheral circuit region. The fifth contact plugs 31 extend through the first interlayer insulation film 9 and the second interlayer insulation film 11. Furthermore, third wires 32 are formed on the second interlayer insulation film 11 in the peripheral circuit region. Each of the third wires 32 is covered with an insulating film 33 and a sidewall insulating film 34. The third wires 32 are connected to the fifth contact plugs 31. The third wires 32 are covered with the cover film 19. The fourth interlayer insulation film 20, the fifth interlayer insulation film 22, and the sixth interlayer insulation film 28 are formed on the cover film 19.

Sixth contact plugs 35 are provided so as to extend through the fourth interlayer insulation film 20, the fifth interlayer insulation film 22, and the sixth interlayer insulation film 28. The second wires 30 and the third wires 32 are connected to each other by the sixth contact plugs 35.

An exemplary embodiment of the present invention will be described with regard to a method of manufacturing the semiconductor device 100 having the structure shown in FIGS. 2(a) and 2(b). Specifically, a method of a manufacturing a semiconductor device 100 according to an embodiment of the present invention is primarily focused on a method of manufacturing the capacitors 27 on the contact pads 18.

A method of manufacturing a semiconductor device 100 according to an embodiment of the present invention will be described below with reference to FIGS. 3(a) to 12(b). The following description illustrates a case of manufacturing a DRAM.

Like in FIGS. 2(a) and 2(b), the figures with a postfix (a) show a boundary area of a memory cell region, whereas the figures with a postfix (b) show a central area of the memory cell region. The upper figures of FIGS. 3(a) to 12(a) are plan views of the boundary area, whereas the lower figures of FIGS. 3(a) to 12(a) are cross-sectional views taken along line A-A of the plan views.

Furthermore, the plan views in the upper figures of FIGS. 3(a) to 12(b) show components on a front face in the respective steps of the manufacturing process. The positions of primary components located below the front face may be indicated by broken lines.

FIGS. 3(a) and 3(b) show a step prior to formation of cylindrical capacitors 27. In this example, FIGS. 3(a) and 3(b) show formation of contact pads 18, which are to be connected to lower electrodes 24 of the capacitors 27.

As shown in FIGS. 3(a) and 3(b), STIs 2 are formed in a silicon substrate 1. Device isolation regions formed of a silicon oxide film ($SiO_2$) or a silicon nitride film (SiN) are provided in the STIs 2. Thus, active regions 3 isolated by the STIs 2 are provided.

Referring to FIGS. 3(a) and 3(b), a gate insulating film 4 of silicon oxide is formed by thermal oxidation on the silicon substrate 1 isolated by the active regions 3. On the gate insulating film 4, a gate electrode 5 is formed by polysilicon by a thermal chemical vapor deposition (CVD) method or by tungsten (W) by a CVD method. An insulating film 6, which is a silicon nitride film, is successively formed on the gate electrode 5 by a plasma CVD method.

Then, etching is conducted while the insulating film 6 is used as a mask. As a result, portions of the gate insulating film 4, the gate electrode 5, and the insulating film 6 are removed so as to produce a gate insulating film 4, a gate electrode 5, and an insulating film 6 of planer MOS transistors as illustrated in FIGS. 3(a) and 3(b). Sidewalls of the planer MOS transistors are covered with a sidewall insulating film 7 of a silicon nitride film by a thermal CVD method. Furthermore, a diffusion layer 8 is formed around the gates of the transistors in the silicon substrate 1 by an ion implantation method. Thereafter, a first interlayer insulation film 9 is formed with use of spin-on dielectrics (SOD) of a coat insulating material so that the transistors are embedded in the first interlayer insulation film 9. In this case, the first interlayer insulation film 9 is flattened by chemical mechanical polishing (CMP).

Next, a photoresist is applied onto the first interlayer insulation film 9. An opening (hole) pattern of a desired shape is formed above any diffusion layer 8 by photolithography. Subsequently, dry etching is conducted while the hole pattern is used as a mask. Thus, first holes (not shown) are formed.

Then the first holes are filled with polysilicon by a thermal CVD method or with a conductive film such as tungsten by a CVD method. Thereafter, a CMP process is performed to remove an excessive conductive film on the first interlayer insulation film 9. Thus, first contact plugs 10 are formed. At that time, the first contact plugs 10 are connected to the diffusion layer 8.

A second interlayer insulation film 11 of a silicon oxide film is deposited on the first interlayer insulation film 9 by a plasma CVD method. Furthermore, photolithography, dry etching, deposition of a conductive film, and a CMP process are conducted on the second interlayer insulation film 11 in the same manner as described above. Thus, second contact plugs 12 filled with a conductive film such as tungsten are formed in the memory cell region, and fifth contact plugs 31 filled with a conductive film such as tungsten are formed in the peripheral circuit region. The second contact plugs 12 are connected to the first contact plugs 10, whereas the fifth contact plugs 31 are connected to the diffusion layer 8.

Furthermore, W is deposited on the second interlayer insulation film 11 by a sputtering method, and a silicon nitride film is deposited thereon by a plasma CVD method. Photolithography and dry etching are conducted for isolation (patterning). Thus, first wires 13, on which an insulating film 14 is stacked, are formed in the memory cell region. Third wires 32, on which an insulating film 33 is stacked, are formed in the peripheral circuit region.

In this case, the first wires 13 are connected to the second contact plugs 12. The third wires 32 are connected to the fifth contact plugs 31. Side surfaces of the first wires 13 are covered with a sidewall insulating film 15 such as a silicon nitride film by a thermal CVD method. Side surfaces of the third wires 32 are covered with a sidewall insulating film 34. The wires are embedded in a third interlayer insulation film 16 of SOD. The third interlayer insulation film 16 is flattened by CMP.

Next, a photoresist is applied to the third interlayer insulation film 16. A desired hole pattern is formed on the photoresist above the first contact plugs 10 by photolithography.

Furthermore, dry etching is conducted so as to form second holes (not shown). Then the second holes are filled with a conductive film such as polysilicon by a thermal CVD method or tungsten by a CVD method. Subsequently, a CMP process is performed to remove an excessive conductive film on the third interlayer insulation film 16. Thus, third contact plugs 17 are formed. The third contact plugs 17 are connected to the first contact plugs 10. A conductive film doped with an impurity, such as polysilicon using a thermal CVD method or W using a CVD method, is deposited on the third interlayer insulation film 16. Then the conductive film is patterned by using the existing photolithography and dry etching. Thus, contact pads 18 are formed.

The contact pads 18 illustrated in the upper figures of FIGS. 3(a) and 3(b) have a circular shape on a plane.

A process performed after the formation of the contact pads 18 will be described with reference to FIGS. 4(a) and 4(b).

A cover film 19 of a silicon nitride film is deposited on the third interlayer insulation film 16 and the third wires 32 shown in FIGS. 3(a) and 3(b) by a thermal CVD method. The cover film 19 serves as a protective film for wet etching.

Then a first amorphous carbon film 36 is deposited on the cover film 19 with a thickness of 1600 nm by a plasma CVD method. The following deposition conditions may be used: Propylene ($C_3H_6$) is used as a raw material gas, a flow rate is 1,000 sccm (standard cubic centimeter per minute), a high-frequency power is 1,000 W, a heating temperature is 500° C., and a pressure is 3 Torr. In this process, helium (He) may be supplied as a carrier gas at 500 sccm. Then first grooves are formed in a sixth contact plug 35 of the peripheral circuit region by dry etching so that the memory cell region is surrounded by the first grooves, and a portion of the cover film 19 is exposed.

Thereafter, the first grooves are filled, and a fourth interlayer insulation film 20 of a silicon oxide film is deposited by a plasma CVD method so that the first amorphous carbon film 36 remaining in the memory cell region is covered with the fourth interlayer insulation film 20. The fourth interlayer insulation film 20 serves as a third insulating film. Furthermore, the fourth interlayer insulation film 20 is removed on the first amorphous carbon film 36 by CMP. The fourth interlayer insulation film 20 is flattened so that the height of the fourth interlayer insulation film 20 in the peripheral circuit region is equal to the height of the first amorphous carbon film 36 in the memory cell region. In this case, the fourth interlayer insulation film 20 is referred to as a first peripheral interlayer insulation film because it is provided around the first amorphous carbon film 36.

A process performed after the formation of the first amorphous carbon film 36 and the fourth interlayer insulation film (first peripheral interlayer insulation film) 20 will be described below with reference to FIGS. 5(a) and 5(b).

A first support film 21, which serves as a first insulating film, is deposited to a thickness of 50 nm by a plasma CVD method so that the fourth interlayer insulation film 20 and the first amorphous carbon film 36 formed in the process shown in FIGS. 4(a) and 4(b) are covered with the first support film 21. For example, the first support film 21 is formed of a silicon nitride film. Then groove-like or slit-like openings 21A, which form a first pattern, are formed in the first support film 21 of the memory cell region by photolithography and dry etching. For example, the width X1 of the openings 21A is 70 nm. Thus, a portion of the first amorphous carbon film 36 is exposed. At that time, as shown in FIGS. 5(a) and 5(b), the openings 21A extend along the Y-direction and overlap the contact pads 18 below the first amorphous carbon film 36. Those openings 21A are arranged in parallel to each other along the X-direction. In this example, the openings 21A in the first support film 21 are in the form of grooves or slits. However, the openings 21A may be in the form of circular holes having a diameter of 70 nm.

Thus, the first support film 21 forms a first insulating film pattern, which is a first pattern. The first support film 21 extends continuously from the memory cell region to the peripheral circuit region and wholly covers the peripheral circuit region, as illustrated in FIG. 5(a). Since the openings 21A of the first insulating film pattern are in the form of grooves or holes, the lower electrodes 24 of the cylindrical capacitors 27 can be supported in opposite directions or in four directions. Furthermore, since the first insulating film pattern extends continuously from the memory cell region to the peripheral circuit region, the lower electrodes 24 can firmly be supported.

FIGS. 6(a) and 6(b) show a process performed after the formation of the openings 21A. Specifically, a second amorphous carbon film 37 is deposited to a thickness of 1,600 nm by a plasma CVD method so that the first support film 21 is covered with the second amorphous carbon film 37 and that the openings 21A are filled with the second amorphous carbon film 37. The following deposition conditions may be used: Propylene ($C_3H_6$) is used as a raw material gas, a flow rate is 1,000 sccm, a high-frequency power is 1,000 W, a heating temperature is 500° C., and a pressure is 3 Torr. In this example, helium (He) may be supplied as a carrier gas at 500 sccm.

Then second grooves are formed in the second amorphous carbon film 37 of the peripheral circuit region by dry etching so that the memory cell region is surround by the second grooves. Thus, a portion of the first support film 21 is exposed. Thereafter, the second groove is filled, and a fifth interlayer insulation film 22, which serves as a fourth insulating film, is deposited by a plasma CVD method so that the second amorphous carbon film 37 remaining in the memory cell region is covered with the fifth interlayer insulation film 22. The fifth interlayer insulation film 22 may be formed of a silicon oxide film. Furthermore, the fifth interlayer insulation film 22 on the second amorphous carbon film 37 is removed by CMP and flattened so that the height of the fifth interlayer insulation film 22 in the peripheral circuit region is equal to the height of the second amorphous carbon film 37 in the memory cell region. The fifth interlayer insulation film 22 may be referred to as a second peripheral interlayer insulation film.

FIGS. 7(a) and 7(b) show a process performed after the formation of the fifth interlayer insulation film (second peripheral interlayer insulation film) 22 and the second amorphous carbon film 37. A second support film 23, which serves as a second insulating film, is deposited to a thickness of 50 nm by a plasma CVD method so that the fifth interlayer insulation film 22 and the second amorphous carbon film 37 are covered with the second support film 23. The second support film 23 may be formed of a silicon nitride film.

Then groove-like or slit-like openings 23A, which form a second pattern, are formed in the second support film 23 of the memory cell region by photolithography and dry etching. For example, the width Y1 of the openings 23A is 70 nm. Thus, a portion of the second amorphous carbon film 37 is exposed. The second pattern may be referred to as a second insulating film pattern.

At that time, the openings 23A extend along the X-direction and overlap a portion of the openings 21A and the contact pads 18 below the second amorphous carbon film 37. Those openings 23A are arranged in parallel to each other along the Y-direction with intervals Y2 of 70 nm. In this example, the openings 23A are in the form of grooves of slits. However, the openings 23A may be in the form of circular holes having a diameter of 70 nm.

At least part of the openings 23A is positioned so as to overlap the openings 21A in a two-dimensional view. Furthermore, when the openings 21A and 23A are in the form of grooves, the openings 23A are arranged perpendicular to the openings 21A. In other words, the openings 21A and 23A cross each other two-dimensionally in the X-Y plane. The openings 21A and 23A are spaced from each other in the Z-direction, which is perpendicular to the X-Y plane.

Furthermore, the second insulating film pattern, which is a second pattern, extends continuously from the memory cell region to the peripheral circuit region, like the first insulating film pattern and wholly covers the peripheral circuit region, as illustrated in FIG. 7(a). The second insulating film pattern has openings 23A in the form of grooves or holes. Those openings 23A are provided so that the lower electrodes 24 are sandwiched in opposite directions or in four directions by the second support film 23. Therefore, the lower electrodes 24 can firmly be supported by the second support film 23. The first support film 21 and the second support film 23 may be collectively referred to as a support portion.

FIGS. 8(a) and 8(b) show a process performed after the formation of the second support film 23 and the openings 23A. A mask film 38 of a silicon oxide film is deposited to a thickness of 100 nm by a plasma CVD method. Thus, the second support film 23 is covered with the mask film 38, and the openings 23A are filled with the mask film 38. Thereafter, groove-like or slit-like openings 38A are formed in the mask film 38 by photolithography and dry etching. The width X3 of the openings 38A is 70 nm. The openings 38A form a mask pattern. In this case, the openings 38A extend along the Y-direction. The openings 38A are positioned so as to overlap at least part of the openings 21A and at least part of the openings 23A. Part of the second amorphous carbon film 37 and the second support film 23 is exposed through the openings 23A and 38A. In this example, the openings 38A are in the form of grooves or slits. However, the openings 38A may be in the form of circular holes having a diameter of 70 nm. At least part of the openings 38A is positioned so as to overlap the openings 23A in a two-dimensional view. Furthermore, when the openings 21A, 23A, and 38A are in the form of grooves, the openings 23A are arranged perpendicular to the openings 21A and 38A.

FIGS. 9(a) and 9(b) show a process performed after the formation of the openings 23A and 38A. In a first step, dry etching is conducted from the top of the openings 38A to the bottom thereof with the openings 21A, 23A, and 38A used as a mask. By this etching process, the second amorphous carbon film 37 exposed at the bottom of the openings 38A are removed together with the first amorphous carbon film 36 that is an underlayer of the second amorphous carbon film 37. As a result, cylindrical holes 39 are formed which extend through the mask film 38, the second support film 23, and the first amorphous carbon film 36. The following dry etching conditions may be used: Ammonia ($NH_3$) and oxygen ($O_2$) are used as raw material gases, a flow rate of $NH_3$ is 300 sccm, and a flow rate of $O_2$ is 30 sccm. A source power is 800 W, a bias power is 50 W, a temperature of a stage is 50° C., and a pressure is 20 mTorr. In this example, argon (Ar) may be supplied as a carrier gas at 200 sccm. The bias power is not limited to 50 W and may be changed in a range from 50 W to 300 W. By adjusting the bias power within the aforementioned range, anisotropic dry etching can be carried out in the Z-direction. Therefore, the openings 21A, 23A, and 38A perpendicularly crossing in the X-Y directions serve to define the cylindrical holes 39 extending through both the first amorphous carbon film 36 and the second amorphous carbon film 37. As a result, the cylindrical holes 39 have a diameter X5 of 70 nm. A portion of the cover film 19 is exposed at the bottoms of the cylindrical holes 39.

Furthermore, this dry etching is conducted with a high selectivity and is therefore helpful to dry-etch only the first amorphous carbon film 36 and the second amorphous carbon film 37. Thus, the mask film 38, the second support film 23, and the cover film 19 remain without being dry etched.

Next, the cover film 19 that forms the bottoms of the cylindrical holes 39 is removed by dry etching, so that a portion of the contact pads 18 is exposed. The following dry etching conditions may be used: Trifluoromethane ($CHF_3$) and oxygen ($O_2$) are used as raw material gases, a flow rate of $CHF_3$ is 80 sccm, and a flow rate of $O_2$ is 20 sccm. A high-frequency power is 3,000 W, a temperature of a stage is 20° C., and a pressure is 30 mTorr. In this example, argon (Ar) may be supplied as a carrier gas at 150 sccm.

This dry etching has a high selectivity so that only the cover film 19 that forms the bottoms of the cylindrical holes 39 is etched. Therefore, the mask film 38, the second support film 23, and the contact pad 18 are left without being etched.

FIGS. 10(a) and 10(b) show a process performed after the formation of the cylindrical holes 39. In this example, lower electrodes 24 of a conductive film are formed to a thickness of 10 nm by a CVD method so that inner walls of the cylindrical holes 39 are covered with the lower electrodes 24. The lower electrodes 24 are formed of titanium nitride (TiN). The lower electrodes 24 are not limited to titanium nitride. Other metals such as ruthenium (Ru) and platinum (Pt) may be used for the lower electrodes 24.

Since the mask film 38 is also covered with the lower electrodes 24, a portion of the lower electrodes 24 on the mask film 38 is removed by CMP.

Then, the mask film 38 is completely removed by wet etching using hydrofluoric acid (HF). At that time, the peripheries of the fourth interlayer insulation film 20 and the fifth interlayer insulation film 22, which are formed of a silicon oxide film like the mask film 38, are covered with the first support film 21, the second support film 23, and the lower electrodes 24, which are not dissolved in hydrofluoric acid. Therefore, the fourth interlayer insulation film 20 and the fifth interlayer insulation film 22 remain. Furthermore, openings 23B are newly formed in the second support film 23, so that the second amorphous carbon film 37 located below the openings 23B is exposed to hydrofluoric acid. Since the second amorphous carbon film 37 is not dissolved in hydrofluoric acid, the second amorphous carbon film 37 is kept without being ethced.

FIGS. 11(a) and 11(b) show a process performed after the formation of the lower electrodes 24. Specifically, ashing is conducted in a second step. The second amorphous carbon film 37 exposed at the bottoms of the openings 23B and the first amorphous carbon film 36, which is an underlayer of the second amorphous carbon film 37, are removed.

The following ashing conditions may be used: Oxygen ($O_2$) is used as a raw material gas, a flow rate is 3,000 sccm, and a source power is 3,000 W. A bias power is 0 W, a temperature of a stage is 200° C., and a pressure is 0.3 Torr. The pressure is not limited to 0.3 Torr and can be changed in a range from 0.3 Torr to 1.0 Torr.

Furthermore, this ashing process serves to remove not only the exposed first amorphous carbon film 36 and second amorphous carbon film 37, but also the first amorphous carbon film 36 located below the first support film 21 and the second amorphous carbon film 37 located below the second support film 23, by adjusting the pressure in the aforementioned range. Additionally, a raw material gas supplied from the openings 23B to the second amorphous carbon film 37 can be increased by adjusting the bias power in a range from 0 W to 100 W. Therefore, a process time for ashing can be shortened.

Moreover, this ashing process is performed with a high selectivity such that only the first amorphous carbon film 36 and the second amorphous carbon film 37 are subjected to the aching. Therefore, the fourth interlayer insulation film 20, the fifth interlayer insulation film 22, the first support film 21, the second support film 23, the lower electrodes 24, and the cover film 19 are left without being removed during the ashing process. As a result, the fourth interlayer insulation film 20 is connected to the first support film 21, and the fifth interlayer insulation film 22 is connected to the second support film 23.

Thus, the lower electrodes 24 are supported in the X-direction by the first support film 21 located at a lower side of the lower electrodes 24 and are supported in the Y-direction by the second support film 23 located at an upper side of the lower electrodes 24.

FIGS. 12(a) and 12(b) show a process of manufacturing capacitors 27, which is performed after the ashing.

A capacitance insulating film 25 is formed by a CVD method or an atomic layer deposition (ALD) method so that exposed surfaces of the lower electrodes 24 are covered with the capacitance insulating film 25. Thereafter, a titanium nitride film is deposited by a CVD method to cover a surface of the capacitance insulating film 25 with the titanium nitride film. Thus, upper electrodes 26 are formed. Thus, the lower electrodes 24 are faced with the upper electrodes 26 via the capacitance insulating film 25. The lower electrodes 24, the capacitance insulating film 25, and the upper electrodes 26 form capacitors. High-dielectric films such as zirconium oxide ($ZrO_2$), aluminum oxide ($Al_2O_3$), and hafnium oxide ($HfO_2$) or multilayered films of those high-dielectric films may be used for the capacitance insulating film 25.

The upper electrodes 26 may have a multilayer structure produced as follows: A titanium nitride film is formed with a thickness of about 10 nm. Then a polysilicon film doped with an impurity is stacked on the titanium nitride film so that cavities or hollow spaces formed between adjacent lower electrodes 24 are filled with the polysilicon film. Furthermore, tungsten (W) is deposited on the polysilicon film to a thickness of about 100 nm. In this case, a metal film of ruthenium (Ru), platinum (Pt), or the like may be used instead of titanium nitride.

Next, dry etching is conducted while a photoresist film (not shown) is used as a mask. Thus, unnecessary films in the peripheral circuit region (including the upper electrodes 26, the capacitance insulating film 25, and the second support film 23) are removed for thereby forming capacitors 27.

Subsequently, as shown in FIGS. 2(a) and 2(b), the upper electrodes 26 are covered with a sixth interlayer insulation film 28 formed of a silicon oxide film or the like. The sixth interlayer insulation film 28 is flattened by CMP. Thereafter, fourth contact plugs 29 and second wires 30 for supplying a certain potential to the upper electrodes 26 are formed. Then a surface protective film or the like is formed. Thus, a semiconductor device 100 (DRAM) illustrated in FIGS. 2(a) and 2(b) is produced.

As described above, according to a method of manufacturing a semiconductor device 100 in this embodiment, a stacked layer of an amorphous carbon film and a support film formed on the amorphous carbon film are doubled. Cylindrical holes are formed so as to extend through those stacked layers. Furthermore, lower electrodes are formed so that inner walls of the cylindrical holes are covered with the lower electrodes.

Upper portions and intermediate portions of the lower electrodes thus produced are connected to the support films, respectively, and the lower electrodes are thus supported by those support films. Therefore, even if the amorphous carbon film is removed in such a state, any short circuit caused by collapse of the intermediate portions of the lower electrodes can be prevented. Cylindrical holes having a higher aspect ratio can readily be formed by providing two or more stacked layers of an amorphous carbon film and a support film formed on the amorphous carbon film. If three or more stacked layers are provided, openings defined in an upper support film should be formed perpendicular to openings defined in a lower support film in a two-dimensional view. When the lower electrodes are formed in the cylindrical holes having a high aspect ratio with three or more stacked layers, the lower electrodes are firmly supported in the X and Y-directions by the support films in the respective layers. Accordingly, the lower electrodes do not collapse.

Although preferred embodiments of the present invention have been described above, the present invention is not limited to the aforementioned exemplary embodiments. As a matter of course, various modifications can be made therein without departing from the sprit of the present invention, and those modifications should be included in this present invention.

What is claimed is:

1. A method of manufacturing a semiconductor device, the method comprising:
   forming a first amorphous carbon film in a memory cell region of a semiconductor substrate and forming a first peripheral interlayer insulation film in a peripheral circuit region of the semiconductor substrate;
   forming a first insulating film so that the first amorphous carbon film and the first peripheral interlayer insulation film are covered with the first insulating film;
   removing a portion of the first insulating film that corresponds to a capacitor portion to be formed in the memory cell region so as to leave the remaining portion of the first insulating film which sandwiches the capacitor portion from at least opposite sides of the capacitor portion and which forms a first insulating film pattern continuously extending from the memory cell region to the peripheral circuit region;
   forming a capacitor in the capacitor portion from which the first insulating film has been removed; and
   then removing the first amorphous carbon film.

2. The method as recited in claim 1, further comprising:
   forming a second amorphous carbon film on the first insulating film pattern and the first amorphous carbon film and forming a second peripheral interlayer insulation film on the first insulating film pattern in the peripheral circuit region, after the first insulating film pattern is formed;
   forming a second insulating film so that the second amorphous carbon film and the second peripheral interlayer insulation film are covered with the second insulating film; and
   removing a portion of the second insulating film that corresponds to the capacitor portion to be formed in the memory cell region so as to leave the remaining portion of the second insulating film which sandwiches the capacitor portion from at least opposite sides of the capacitor portion and which forms a second insulating film pattern continuously extending from the memory cell region to the peripheral circuit region,
   wherein the removing of the first amorphous carbon film includes removing the second amorphous carbon film.

3. The method as recited in claim 2, wherein the portion of the first insulating film removed in the first insulating film pattern is in a form of a groove linearly extending in a predetermined direction, and the portion of the second insulating film removed in the second insulating film pattern is in a form of a groove linearly extending in a direction crossing the predetermined direction.

4. A method of manufacturing a semiconductor device, the method comprising:

forming a first amorphous carbon film on a semiconductor substrate;

forming a first insulating film so that the first amorphous carbon film is covered with the first insulating film;

forming a first pattern in the first insulating film;

forming a second amorphous carbon film so that the first pattern is filled with the second amorphous carbon film;

forming a second insulating film so that the second amorphous carbon film is covered with the second insulating film;

forming a second pattern in the second insulating film;

forming a hole extending from the second insulating film to the first amorphous carbon film while using the second pattern as a mask;

forming a conductive film so that an inner wall of the hole is covered with the conductive film; and removing the first amorphous carbon film and the second amorphous carbon film after the forming of the conductive film.

5. The method as recited in claim 4, further comprising:

forming a mask film so that the second pattern is filled with the mask film; and forming a mask pattern in the mask film, wherein the forming of the hole includes forming the hole extending from the mask film to the first amorphous carbon film while using the mask pattern as a mask.

6. The method as recited in claim 5, wherein at least part of the mask pattern overlaps the second pattern in a two-dimensional view.

7. The method as recited in claim 5, wherein the first pattern is formed by a groove, the second pattern is formed by a groove extending perpendicular to the groove of the first pattern, and the mask pattern is formed by a hole.

8. The method as recited in claim 5, wherein the first pattern and the mask pattern are formed by a groove, the second pattern is formed by a groove extending perpendicular to the grooves of the first pattern and the mask pattern.

9. The method as recited in claim 4, wherein at least part of the second pattern overlaps the first pattern in a two-dimensional view.

10. The method as recited in claim 4, wherein the first pattern is formed by a hole, and the second pattern is formed by a hole.

11. The method as recited in claim 4, wherein the first pattern is formed by a groove, and the second pattern is formed by a hole.

12. The method as recited in claim 4, further comprising:

forming a first groove in the first amorphous carbon film so that a formation region in which the hole is to be formed is surrounded by the first groove;

forming a third insulating film so that the first groove is filled with the third insulating film;

forming a second groove in the second amorphous carbon film so that a region in which the hole is to be formed is surrounded by the second groove; and forming a fourth insulating film so that the second groove is filled with the fourth insulating film, wherein, in the removing of the first amorphous carbon film and the second amorphous carbon film, the third insulating film is connected to the first insulating film, and the fourth insulating film is connected to the second insulating film.

* * * * *